(12) United States Patent
Takai et al.

(10) Patent No.: US 12,398,992 B2
(45) Date of Patent: Aug. 26, 2025

(54) CARRIER MEASUREMENT DEVICE, CARRIER MEASUREMENT METHOD, AND CARRIER MANAGEMENT METHOD

(71) Applicant: SUMCO CORPORATION, Tokyo (JP)

(72) Inventors: Hiroshi Takai, Tokyo (JP); Takeshi Kuroiwa, Tokyo (JP); Ryosuke Kido, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 373 days.

(21) Appl. No.: 18/030,660

(22) PCT Filed: Oct. 4, 2021

(86) PCT No.: PCT/JP2021/036539
§ 371 (c)(1),
(2) Date: Apr. 6, 2023

(87) PCT Pub. No.: WO2022/080159
PCT Pub. Date: Apr. 21, 2022

(65) Prior Publication Data
US 2023/0384077 A1    Nov. 30, 2023

(30) Foreign Application Priority Data

Oct. 12, 2020   (JP) .................................. 2020-171944

(51) Int. Cl.
*G01B 5/06* (2006.01)
*B24B 37/005* (2012.01)
*H01L 21/67* (2006.01)

(52) U.S. Cl.
CPC .............. *G01B 5/06* (2013.01); *B24B 37/005* (2013.01); *H01L 21/67288* (2013.01)

(58) Field of Classification Search
CPC ............................ G01B 5/06; H01L 21/67288

(Continued)

(56) References Cited

U.S. PATENT DOCUMENTS 3,735,534 A * 5/1973 Mayo ...................... B24B 13/00
451/6
5,234,499 A * 8/1993 Sasaki ................ H01L 21/6715
118/52

(Continued)

FOREIGN PATENT DOCUMENTS

JP      2012-145439 A     8/2012
JP          5732858 B2     6/2015

(Continued)

OTHER PUBLICATIONS

International Search Report issued in WIPO Patent Application No. PCT/JP2021/036539, dated Dec. 21, 2021, along with an English translation thereof.

(Continued)

*Primary Examiner* — George B Bennett
(74) *Attorney, Agent, or Firm* — Greenblum & Bernstein, P.L.C.

(57) ABSTRACT

A carrier measuring device includes a rotary table, a table drive motor, an upper thickness sensor, a lower thickness sensor and a slide unit. The rotary table includes a carrier receiver configured to horizontally house a carrier formed with a hole in which a semiconductor wafer is held, the hole being eccentric with respect to the carrier. The table drive motor rotates the rotary table around a center axis thereof as a rotation axis. The upper thickness sensor and the lower thickness sensor are positioned above and below the carrier, respectively, and measure a thickness of the carrier in a non-contact manner. The slide unit slides the rotary table in a horizontal direction. The carrier receiver is formed to be capable of housing the carrier in a manner that a center of the hole coincides with a center of the rotary table.

6 Claims, 7 Drawing Sheets

(58) Field of Classification Search
USPC .......................................................... 33/549
See application file for complete search history.

(56) References Cited

U.S. PATENT DOCUMENTS

| | | | |
|---|---|---|---|
| 6,544,103 B1 | 4/2003 | Korovin | |
| 10,391,603 B2* | 8/2019 | Yamaki | B24B 37/005 |
| 10,569,381 B2* | 2/2020 | Yoshida | B24B 37/32 |
| 10,605,583 B2* | 3/2020 | Honda | G01G 19/083 |
| 10,622,232 B2* | 4/2020 | Ha | H01L 21/67115 |
| 10,699,926 B2* | 6/2020 | Plihal | G06T 7/001 |
| 11,171,056 B2* | 11/2021 | Yamamoto | H01L 21/67288 |
| 11,387,726 B2* | 7/2022 | Sakai | H02K 41/031 |
| 11,450,523 B2* | 9/2022 | Tanoue | B23K 26/032 |
| 11,598,007 B2* | 3/2023 | Akashi | C23C 16/46 |
| 12,183,642 B2* | 12/2024 | Nabeya | H01L 22/26 |
| 2017/0069502 A1 | 3/2017 | Sato et al. | |
| 2021/0164769 A1 | 6/2021 | Jung | |
| 2024/0238934 A1* | 7/2024 | Ota | B24B 37/005 |
| 2024/0353344 A1* | 10/2024 | Kinoshita | H01L 22/12 |
| 2025/0046646 A1* | 2/2025 | Taguchi | H01L 21/68771 |
| 2025/0051920 A1* | 2/2025 | Fukushi | H01L 21/68771 |

FOREIGN PATENT DOCUMENTS

| | | |
|---|---|---|
| JP | 2015-174168 A | 10/2015 |
| JP | 6056793 B2 | 1/2017 |
| JP | 2017-159382 A | 9/2017 |
| JP | 2019-509465 A | 4/2019 |
| JP | 6578442 B2 | 9/2019 |
| JP | 2019-186490 A | 10/2019 |
| JP | 2020-49612 A | 4/2020 |
| KR | 10-2000-0003078 | 1/2000 |
| KR | 10-2013-0084861 | 7/2013 |
| KR | 10-2016-0133437 | 11/2016 |
| KR | 10-2017-0104925 | 9/2017 |
| KR | 10-1856875 | 5/2018 |

OTHER PUBLICATIONS

Written Opinion issued in WIPO Patent Application No. PCT/JP2021/036539, dated Dec. 21, 2021.

Office Action issued in Corresponding KR Patent Application No. 10-2023-7012110, dated Jan. 20, 2025, along with an English translation thereof.

International Preliminary Report on Patentability issued in Corresponding International Application No. PCT/JP2021/036539, dated Apr. 13, 2023, along with an English translation thereof.

Office Action issued in Corresponding KR Patent Application No. 10-2023-7012110, dated Sep. 23, 2024, along with an English translation thereof.

* cited by examiner

CARRIER MEASUREMENT DEVICE, CARRIER MEASUREMENT METHOD, AND CARRIER MANAGEMENT METHOD

TECHNICAL FIELD

The present invention relates to a carrier measuring device and a carrier measurement method for measuring a thickness and a shape of carriers each having a hole for holding a disc-shaped semiconductor wafer, and a carrier management method for managing carriers on a basis of measurement results obtained by measuring a thickness and a shape of the carriers.

BACKGROUND ART

In a manufacturing process of semiconductor wafers used as substrates of semiconductor devices, in order to attain high flatness and low surface roughness of the semiconductor wafers, both sides of the semiconductor wafers are simultaneously polished (i.e., double-side polishing of each semiconductor wafer is performed). Specifically, a plurality of disc-shaped carriers respectively holding the semiconductor wafers in circular holes formed therein are mounted in a double-side polishing device, and both sides of each semiconductor wafer are simultaneously polished while the semiconductor wafers are sandwiched between a pair of platens each attached with a polishing pad.

A region of the semiconductor wafer in which the semiconductor devices are formed has recently become larger year by year toward an outer circumferential portion from a central portion of the semiconductor wafer. Thus, higher flatness has been required in not only the central portion but also the outer circumferential portion of the semiconductor wafer. In order to polish the outer circumferential portion of the semiconductor wafer (hereinafter abbreviated as a "wafer outer circumferential portion") so that the wafer outer circumferential portion has high flatness, it is important that the carrier having the hole for holding the semiconductor wafer should have a highly flat portion surrounding the hole (hereinafter abbreviated as a "hole surrounding portion").

This is because low flatness, for instance, a thin part (occasionally also referred to as a "roll-off") of the hole surrounding portion of the carrier causes the polishing pad for double-side polishing to enter the thin part and excessively polish to thin the wafer outer circumferential portion since the wafer outer circumferential portion is in contact with the hole surrounding portion (this phenomenon is also referred to as "roll-off").

Since the plurality of carriers holding the respective semiconductor wafers are mounted in the double-side polishing device for polishing, it is required that not only the individual carriers should have high flatness but also the carriers mounted together in the double-side polishing device in performing one batch of double-side polishing should have constant thickness and shape.

In a case where the thickness and shape of the carriers are varied among the carriers used in one batch of double-side polishing, the polishing pad is intensively pressed against the carrier having roll-off in the hole surrounding portion, resulting in a variation in shape among the semiconductor wafers in the batch to cause a variation in quality among the semiconductor wafers polished in the batch.

Therefore, as preparation for double-side polishing of the semiconductor wafers, it is important to accurately measure the thickness and shape of each carrier (particularly the hole surrounding portion thereof) and select carriers to be used in one batch from the carriers having less variance in thickness and shape.

As described in, for instance, Patent Literature 1, a conventional measuring device configured to measure the thickness of the carrier includes a table on which the carrier is placeable, a reference rod, a contact sensor and a controller.

The controller, while the carrier is not placed on the table, brings the reference rod and the contact sensor into contact with the table and determines a reference value at a point where the contact sensor contacts with the table. Next, the controller, while the carrier is placed on the table, brings the reference rod and the contact sensor respectively into contact with an upper surface of the carrier and the table and determines a measurement value at a point where the contact sensor contacts with the table. The controller calculates the thickness of the carrier by using a difference between the reference value and the measurement value.

As described in, for instance, Patent Literature 2, another conventional measuring device for the thickness of the carrier includes a first table, a second table, an upper sensor, a lower sensor and a sensor drive unit.

The first table, which is disc-shaped, is disposed in a rotatable manner and supports a central portion of the carrier. The second table, which is shaped in a ring plate, is disposed outside the first table in a rotatable manner and supports an outer circumferential portion of the carrier.

The upper sensor and the lower sensor, which are respectively attached to an end of an upper arm portion and an end of a lower arm portion of a C-shaped support member, calculate the thickness of the carrier. The sensor drive unit moves the upper sensor and the lower sensor by rotating the support member to position the upper sensor and the lower sensor above and below the carrier, respectively.

The second table is rotated with the outer circumferential portion of the carrier being supported by the second table, and the upper sensor and the lower sensor measure a thickness of an inner circumferential portion of the carrier. Moreover, the first table is rotated with the inner circumferential portion of the carrier being supported by the first table, and the upper sensor and the lower sensor measure a thickness of the outer circumferential portion of the carrier.

Further, Patent Literature 3 describes that a flatness distribution of the portion surrounding the hole formed in the carrier is measured by using a laser displacement sensor.

CITATION LIST

Patent Literature(s)

Patent Literature 1: JP Patent No. 5732858 (claim 1)
Patent Literature 2: JP Patent No. 6578442 (paragraphs 0033 to 0039, 0045 to 0049 and 0063 to 0072 and FIGS. 7, 8 and 9a to 9i)
Patent Literature 3: JP Patent No. 6056793 (paragraph 0052)

SUMMARY OF THE INVENTION

Problem(s) to be Solved by the Invention

In the conventional art described in Patent Literature 1, measurement positions are selected one by one and the thickness of the carrier is measured at each position. Thus, a large amount of time and effort is required to measure the thickness of the carrier along the entire hole surrounding portion and the carrier having roll-off in the hole surrounding portion cannot be easily and quickly detected.

In order to hold the wafer so that the wafer is eccentric with respect to the carrier, the carrier may be formed with a hole whose center is offset from a center of the carrier. However, in the conventional art described in Patent Literature 2, in the measurement, the carrier is rotated around a center axis thereof and the upper sensor and the lower sensor are moved by being rotated by the sensor drive unit to be positioned above and below the carrier, respectively. Thus, in the conventional art described in Patent Literature 2, the thickness of the carrier along the entire hole surrounding portion that surrounds the eccentric hole cannot be measured, so that the carrier having roll-off in the hole surrounding portion cannot be detected.

In this regard, Patent Literature 3, which describes in paragraph 0052 that the flatness distribution of the portion surrounding the hole formed in the carrier is measured by using a laser displacement sensor, fails to describe any specific configuration of a measuring device used for the measurement.

Therefore, there has been desired a configuration of accurately measuring the thickness and shape of each carrier (particularly the hole surrounding portion that surrounds the eccentric hole thereof), thereby enabling selection of carriers to be used in one batch from the carriers having less variance in thickness and shape.

An object of the invention is to provide a carrier measuring device, a carrier measurement method and a carrier management method capable of accurately measuring a thickness and a shape of each of carriers (particularly a hole surrounding portion that surrounds an eccentric hole thereof) and enabling selection of carriers to be used in one batch from the carriers having less variance in thickness and shape.

Means for Solving the Problem(s)

According to an aspect of the invention, a carrier measuring device configured to measure a thickness of a carrier having a hole in which a disc-shaped semiconductor wafer is to be held, the hole being eccentric with respect to the carrier, includes: a rotary table including a carrier receiver configured to horizontally house the carrier; a table drive motor configured to rotate the rotary table around a center axis thereof as a rotation axis; an upper thickness sensor and a lower thickness sensor configured to be positioned above and below the carrier, respectively, and measure the thickness of the carrier in a non-contact manner; and a slide unit configured to slide, in a horizontal direction, one or both of: the rotary table; and the upper thickness sensor and the lower thickness sensor, in which the carrier receiver is formed to be capable of housing the carrier in a manner that a center of the hole of the carrier coincides with a center of the rotary table.

The carrier measuring device according to the aspect of the invention further includes a sensor frame attached with the upper thickness sensor and the lower thickness sensor between which the rotary table is capable of passing through in the horizontal direction.

In the carrier measuring device according to the aspect of the invention, the upper thickness sensor and the lower thickness sensor are attached to the sensor frame in a manner to be respectively positioned above and below a straight line passing through the center of the rotary table and a center of the carrier receiver, and the slide unit slides one or both of the rotary table and the sensor frame in the horizontal direction parallel to the straight line.

According to another aspect of the invention, a carrier measurement method for measuring, by using the above carrier measuring device, a thickness of a disc-shaped carrier having a hole in which a disc-shaped semiconductor wafer is to be held, the hole being eccentric with respect to the carrier, includes: first measuring the thickness of the carrier at a predetermined point while sliding, in the horizontal direction, one or both of: the rotary table in which the carrier is housed; and the upper thickness sensor and the lower thickness sensor; and second measuring a thickness of a hole surrounding portion that surrounds the hole of the carrier while rotating the rotary table in which the carrier is housed.

According to still another aspect of the invention, a carrier management method for managing, on a basis of measurement results obtained through measurement using the above carrier measuring device, a plurality of disc-shaped carriers each having a hole in which a disc-shaped semiconductor wafer is to be held, the hole being eccentric with respect to the corresponding carrier, includes: first measuring the thickness of each of the carriers at a predetermined point while sliding, in the horizontal direction, one or both of: the rotary table in which the carrier is housed; and the upper thickness sensor and the lower thickness sensor; classifying the carriers falling within a predetermined range of the thickness into the same class on a basis of the measurement results in the first measuring; selecting a predetermined number of carriers from the carriers belonging to the same class to determine a carrier set to be used in the same batch in double-side polishing of the semiconductor wafers; second measuring a thickness of a hole surrounding portion that surrounds the hole of each of the carriers of the carrier set while rotating the rotary table in which the carriers are housed; and ranking the carrier set on a basis of the measurement results in the first and second measuring according to a specification required for the semiconductor wafers.

In the carrier management method according to the aspect of the invention, in the ranking, a roll-off amount of the hole surrounding portion of each of the carriers is calculated on a basis of the measurement results in the second measuring and the carrier set is ranked on a basis of the measurement results in the first measuring and the roll-off amounts of the hole surrounding portions.

According to the above aspects of the invention, the thickness and shape of each carrier (particularly the hole surrounding portion that surrounds the eccentric hole thereof) can be accurately measured, so that carriers to be used in one batch can be selected from the carriers having less variance in thickness and shape.

BRIEF DESCRIPTION OF DRAWING(S)

DESCRIPTION OF EMBODIMENT(S)

Figure 1:
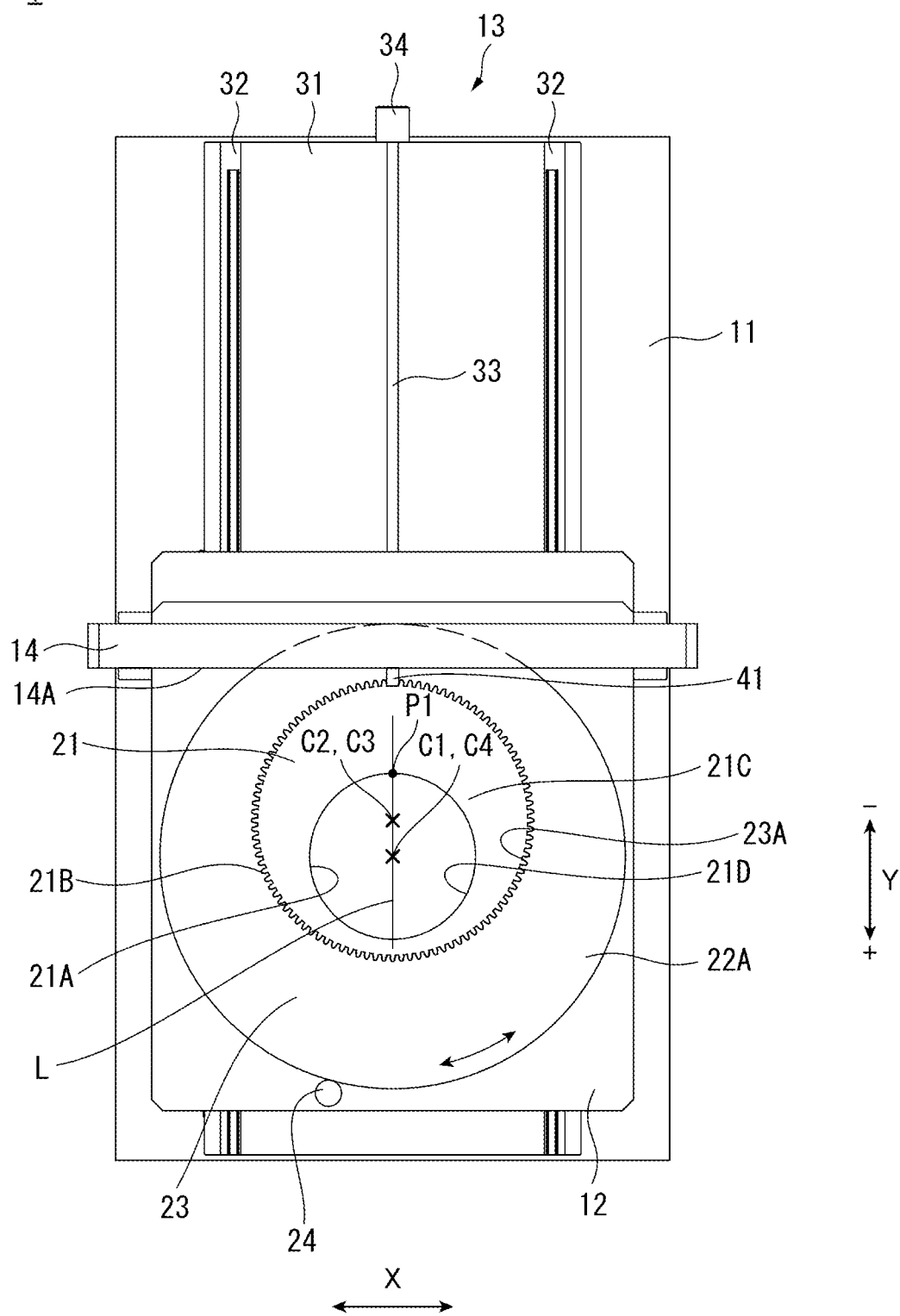
FIG. 1 is a top view showing an example of a schematic structure of a carrier measuring device according to an exemplary embodiment of the invention.
Figure 2:
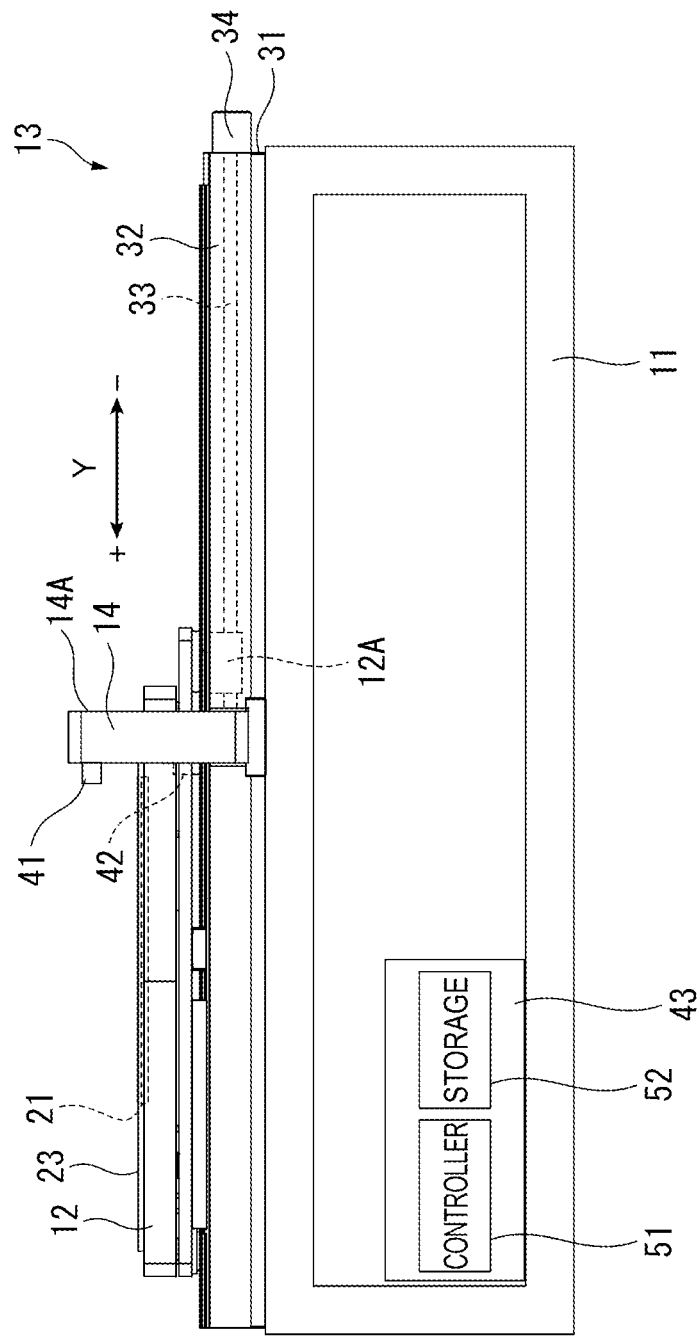
FIG. 2 is a right-side view of the carrier measuring device shown in FIG. 1.
Figure 3:
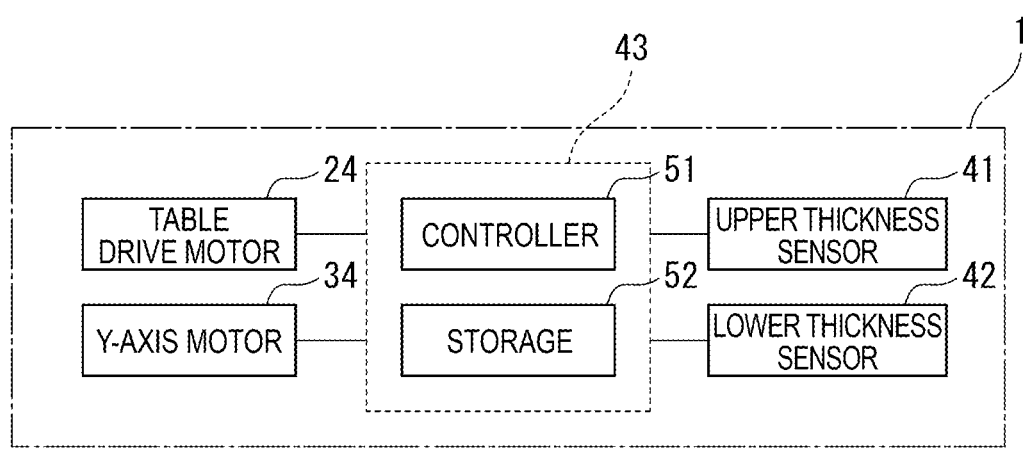
FIG. 3 is a block diagram showing an example of a schematic structure of a control system in the carrier measuring device shown in FIG. 1.

Exemplary embodiments of the invention are described below with reference to the attached drawings.
Structure of Cartier Measuring Device FIGS. 1 and 2 are respectively a top view and a right-side view showing an example of a schematic structure of a carrier measuring device 1 according to an exemplary embodiment of the invention. FIG. 3 is a block diagram showing an example of a schematic structure of a control system in the carrier measuring device 1.

The carrier measuring device 1 includes a platform 11, which has a frame structure shaped in a rectangular parallelepiped as a whole. A rectangular plate-shaped base 31 is fixed on the platform 11.

A guide rail 32 is fixed on an upper surface of the base 31 at each of sides in a longitudinal direction thereof. A rectangular plate-shaped stage 12 is placed on the guide rails 32 in a slidable manner.

A ball screw 33 is disposed in a middle in a width direction (an X-axis direction shown in FIG. 1) of the base 31.

As shown in FIG. 2, an Y-axis motor 34 is attached to one end of the ball screw 33, specifically to a rear end of the ball screw 33 in a Y-axis direction. Meanwhile, a lower portion 12A of the stage 12 is attached to a position close to the other end of the ball screw 33, specifically to a position close to a front end of the ball screw 33 in the Y-axis direction.

This arrangement enables, by rotational drive of the Y-axis motor 34, the stage 12 to slide on the guide rails 32 in front and back (i.e., positive and negative) directions of the Y axis via the ball screw 33. Here, a slide unit 13 includes the base 31, the pair of guide rails 32, the ball screw 33 and the Y-axis motor 34.

Hereinafter, a longitudinal direction of the base 31 from a back toward a front of the carrier measuring device 1 is defined as a Y-axis positive direction and a longitudinal direction of the base 31 from the front toward the back of the carrier measuring device 1 is defined as a Y-axis negative direction.

A table receiver 22A is formed in an upper surface of the stage 12.

A disc-shaped rotary table 23 is housed in the table receiver 22A in a rotatable manner.

A carrier receiver 23A, which is in a form of a circular recess and has a slightly larger diameter than a later-described carrier 21, is formed in an upper surface of the rotary table 23. The carrier 21, which is disc-shaped, is horizontally housed in the carrier receiver 23A.

An outer circumferential portion of the carrier 21 is provided with outer circumferential teeth 21B at a predetermined pitch. The carrier 21 may include a body made from a metal material such as stainless steel or titanium and a ring-shaped resin inserter disposed along an inner wall of the carrier 21, the inner wall defining a hole 21A for holding a semiconductor wafer. Alternatively, an entirety of the carrier 21 may be formed from a resin. When the carrier 21 is made from a resin, the resin to be used is preferably a composite of an epoxy resin and a glass fiber.

The rotary table 23 is rotationally driven by a table drive motor 24.

A sensor frame 14, which is flat O-shaped (i.e., hollow rectangular) in a front view thereof, is fixed on a central portion of an upper surface of the platform 11 across a width direction of the platform 11. The stage 12 can pass through an opening 14A of the sensor frame 14 in the Y-axis direction.

An upper thickness sensor 41 and a lower thickness sensor 42 are each attached to the sensor frame 14 at a middle in a longitudinal direction on a front thereof, the upper thickness sensor 41 and the lower thickness sensor 42 being at a predetermined distance from each other in a vertical direction. The upper thickness sensor 41 and the lower thickness sensor 42 are each, for instance, a spectral interference laser displacement sensor. The upper thickness sensor 41 and the lower thickness sensor 42 can measure a thickness along an entire circumference of the hole surrounding portion 21C defining the hole 21A formed in the carrier 21 at one point per predetermined central angle of the hole 21A specified by an operator. Further, in a measurable area of the hole surrounding portion 21C, measurement is performed at innermost points and then points gradually radially outward, enabling expansion of a measurement circle.

In measuring the thickness of the hole surrounding portion 21C, the table drive motor 24 horizontally rotates the rotary table 23 around a center axis vertically passing through a center C1 of the rotary table 23 as a rotation axis by the central angle specified by the operator. In accordance with rotation of the rotary table 23, the upper thickness sensor 41 and the lower thickness sensor 42 measure the thickness of the hole surrounding portion 21C along its entire circumference defining the hole 21A formed in the carrier 21 at one point per predetermined central angle of the hole 21A specified by the operator. The upper thickness sensor 41 and the lower thickness sensor 42 can measure the thickness of the hold surrounding portion 21C, for instance, at a total of 360 points (i.e., at one point per degree of the central angle of the hole 21A).

The platform 11 is installed with a computer 43 configured to control each of components of the device. The computer 43 includes: a controller 51 including a Central Processing Unit (CPU) and the like; and a storage 52 including a recording circuit such as a memory or a hard disk (see FIG. 3).

The controller 51 reads and executes various programs (e.g., a carrier measurement program and a carrier management program) stored in the storage 52. The storage 52 stores the various programs (e.g., the carrier measurement program and the carrier management program) and various data used for executing the various programs.

As shown in FIG. 1, a center C2 of the carrier receiver 23A is eccentric with respect to the center C1 of the rotary table 23 toward the back of the carrier measuring device 1 (i.e., in the Y negative direction). In the exemplary embodiment, a radial distance from the center C2 of the carrier receiver 23A to the center C1 of the rotary table 23 is defined as an eccentricity amount of the carrier receiver 23A with respect to the rotary table 23.

In the exemplary embodiment, when a straight line L passing through the center C2 of the carrier receiver 23A and the center C1 of the rotary table 23 is parallel to the Y direction as shown in FIG. 1, the center C2 of the carrier receiver 23A is positioned close to an outer circumference of the rotary table 23 with respect to the center C1 of the rotary table 23 (i.e., close to either the front or back of the carrier measuring device 1). A direction indicating this position of the center C2 of the carrier receiver 23A with respect to the center C1 of the rotary table 23 is defined as an eccentricity direction of the carrier receiver 23A. In the example of FIG. 1, since the center C2 of the carrier receiver 23A is positioned close to the back of the carrier measuring device 1 with respect to the center C1 of the rotary table 23, the eccentricity direction of the carrier receiver 23A is the Y negative direction.

In the example shown in FIG. 1, the carrier 21 is housed in the carrier receiver 23A such that a center C4 of the hole 21A formed in the carrier 21 is eccentric with respect to a center C3 of the carrier 21 toward the front of the carrier measuring device 1 (i.e., in the Y positive direction). That is, an eccentricity direction of the hole 21A is the Y positive direction. It should be noted that the center C3 of the carrier 21 coincides with the center C2 of the carrier receiver 23A.

The reason why the carrier receiver 23A is formed as shown in FIG. 1 and the carrier 21 is housed in the carrier receiver 23A in the direction shown in FIG. 1 is as follows.

A conventionally known device for simultaneously polishing both sides of a plurality of semiconductor wafers is a double-side polishing device using a planetary gear mechanism. The double-side polishing device includes: a rotary platen including an upper platen and a lower platen; a sun gear provided in a center of the rotary platen; an internal gear provided at an outer circumferential portion of the rotary platen; and a plurality of carriers provided between the upper platen and the lower platen, an outer circumference of each carrier being formed with outer circumferential teeth at a predetermined pitch.

In the double-side polishing device, each carrier rotates between the upper platen and the lower platen by the outer circumferential teeth of the carrier engaging with each of the sun gear and the internal gear, whereby planetary movement of the carrier is performed in which the carrier revolves around the sun gear while rotating around a center axis thereof. In the planetary movement, when a center of the carrier coincides with a center of a hole formed in the carrier, both sides of the semiconductor wafer housed in the hole are always polished by the same portion of a polishing pad, so that not only a polishing efficiency is low but also desired flatness of the semiconductor wafer is not obtainable.

In order to enhance the polishing efficiency of the semiconductor wafer and uniformity in polishing of the semiconductor wafer, the center of the carrier and the center of the hole are made not to coincide with each other, i.e., the hole is made eccentric with respect to the carrier.

By simply rotating the rotary table 23 in which the carrier 21 formed with the hole 21A that is eccentric with respect to the carrier 21 for the above reason is housed in the carrier receiver 23A whose center coincides with the center C1 of the rotary table 23, the thickness of the hole surrounding portion 21C defining the eccentric hole 21A cannot be measured along the entire circumference thereof.

Thus, in the exemplary embodiment, an eccentricity amount of the hole 21A with respect to the carrier 21 is set the same as the eccentricity amount of the carrier receiver 23A with respect to the rotary table 23 and the eccentricity direction of the hole 21A (i.e., Y positive direction) is set opposite by 180 degrees to the eccentricity direction of the carrier receiver 23A (i.e., Y negative direction), as shown in FIG. 1. In this arrangement, when the carrier 21 is housed in the carrier receiver 23A of the rotary table 23, eccentricity of the hole 21A with respect to the carrier 21 is offset by eccentricity of the carrier receiver 23A with respect to the rotary table 23. Therefore, since the center C4 of the hole 21A coincides with the center C1 of the rotary table 23, by rotating the rotary table 23 around the center axis thereof as a rotation axis with the upper thickness sensor 41 and the lower thickness sensor 42 (see FIGS. 1 and 2) remaining fixed in alignment in a certain position, the thickness of the hole surrounding portion 21C that surrounds the hole 21A of the carrier 21 can be measured along the entire circumference thereof.

Carrier Measurement Method

Next, an example of a carrier measurement method using the carrier measuring device 1 having the above-described structure is described. In the exemplary embodiment, the upper thickness sensor 41 and the lower thickness sensor 42 each remain fixed at the middle in the longitudinal direction of the sensor frame 14.

(1) Measurement of Carrier 21 in Y Direction

When the straight line L passing through the center C2 of the carrier receiver 23A and the center C1 of the rotary table 23 is parallel to the Y direction as shown in FIG. 1, the stage 12 in which the carrier 21 is placed is slid in the Y positive direction and concurrently a thickness of the carrier 21 is measured by the upper thickness sensor 41 and the lower thickness sensor 42.

A measurement pitch at this time can be set to any pitch and is, for instance, 0.2 mm. In this case, the measurement is performed at five points in a 1-mm section. A specific measurement position is on the straight line L (shown in FIG. 1) passing through the center C2 of the carrier receiver 23A and the center C1 of the rotary table 23 and in a range of 50 mm in the Y negative direction from a position that is, for instance, approximately 5 to 7 mm distant from a point $P_1$ of an edge (hole edge) 21D defining the hole 21A.

(2) Measurement of Hole Surrounding Portion 21C

After the stage 12 is slid in the Y negative direction so that the hole surrounding portion 21C that surrounds the hole 21A formed in the carrier 21 is positioned between the upper thickness sensor 41 and the lower thickness sensor 42, the stage 12 is stopped. In this state, the rotary table 23 is rotated and concurrently the thickness of the hole surrounding portion 21C is measured by the upper thickness sensor 41 and the lower thickness sensor 42. At this time, a measurement pitch in a rotation direction can be set to any pitch. For instance, the hole surrounding portion 21C is measured at a total of 360 points (i.e., at one point per degree of the central angle of the hole 21A) along the entire circumference thereof.

A roll-off amount of the hole surrounding portion 21C is defined as a value obtained by subtracting, from an average thickness of the carrier 21 in a reference surface defined as a reference for measuring the roll-off amount, a minimum thickness of the carrier 21 in a region of, for instance, 2 mm from the hole edge 21D defining the hole 21A toward the outer circumference of the carrier 21. Here, the reference surface refers to a region of an upper surface of the carrier 21, which is located at a predetermined distance from the hole edge 21D toward the outer circumference of the carrier 21 and where the thickness of the hole surrounding portion 21C is unlikely to change.

Figure 4A:
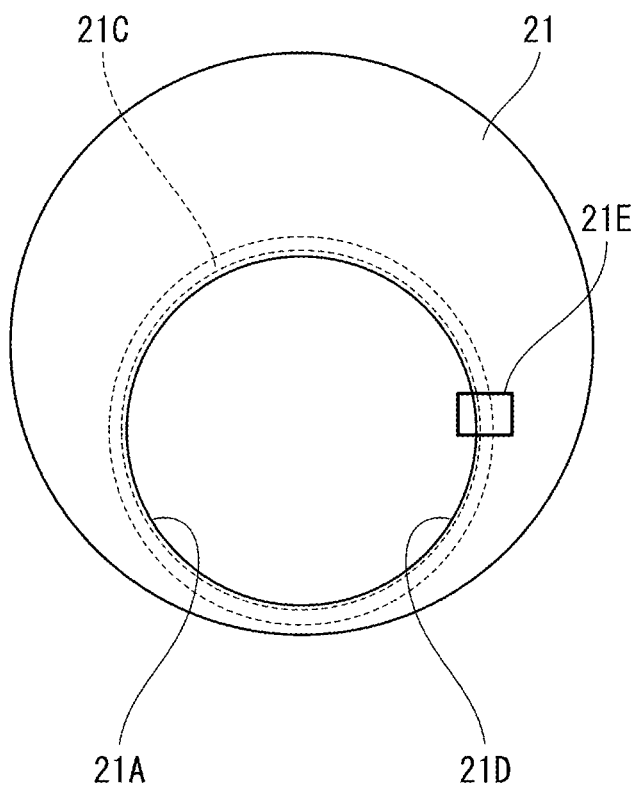
FIG. 4A is a top view showing an example of an external configuration of a carrier.
Figure 4B:
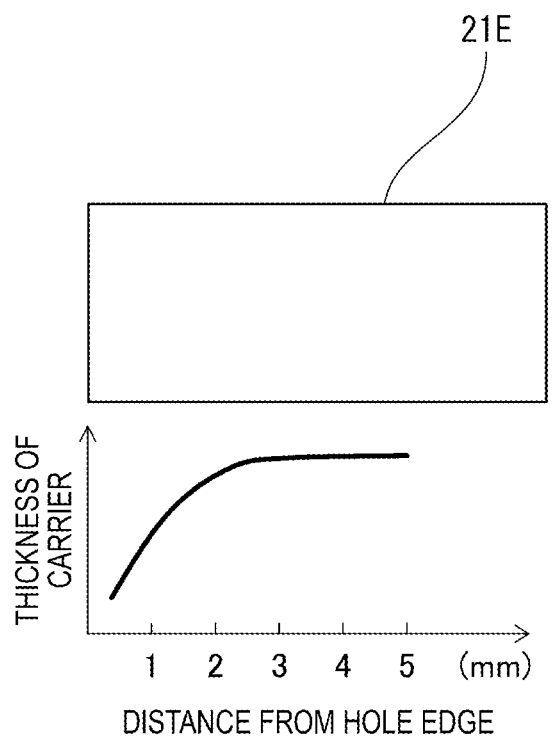
FIG. 4B illustrates an enlarged view of a part of a hole surrounding portion of the carrier and also illustrates a graph showing an example of a relationship between a distance from a hole edge and a thickness of the carrier.

FIG. 4A is a top view of the carrier 21. FIG. 4B illustrates an enlarged view of a part 21E of the hole surrounding portion 21C and also illustrates a graph showing an example of a relationship between a distance on one line from the hole edge 21D and the thickness of the carrier 21.

As is clear from the graph shown in FIG. 4B, the thickness of the hole surrounding portion 21C changes in a region located from the hole edge 21D to a position slightly beyond 2 mm toward the outer circumference of the carrier 21, but does not change outside the region located from the hole edge 21D to the position slightly beyond 2 mm toward the outer circumference of the carrier 21. A region of the upper surface of the carrier 21 that is approximately 3 mm to 5 mm distant from the hole edge 21D toward the outer circumference of the carrier 21 can be thus defined as the reference surface. In FIG. 4A, an annular region surrounded by two dashed lines is the reference surface. A measurement pitch for measuring the thickness of the hole surrounding portion 21C from the hole edge 21D toward the outer circumference of the carrier 21 can be set to any pitch and is, for instance, 0.2 mm. In this case, the measurement is performed at five points in a 1-mm section.

Meanwhile, since the thickness of the hole surrounding portion 21C significantly decreases in the region reaching 2 mm from the hole edge 21D toward the outer circumference of the carrier 21, a difference between the minimum thickness of the carrier 21 in this region and the average thickness of the carrier 21 in the reference surface is defined as the above-described roll-off amount on one line.

Carrier Management Method

Next, an example of a carrier management method using the carrier measuring device 1 and the carrier measurement method is described.

(A) Carrier Management Method for Standard Semiconductor Wafers

First, description is made on the management method of carriers 21 used in double-side polishing of standard semiconductor wafers that require a standard specification (e.g., flatness and surface roughness). In this carrier management method, only the measurement (1) of the carrier measurement method is performed on new carriers 21.

Figure 5:
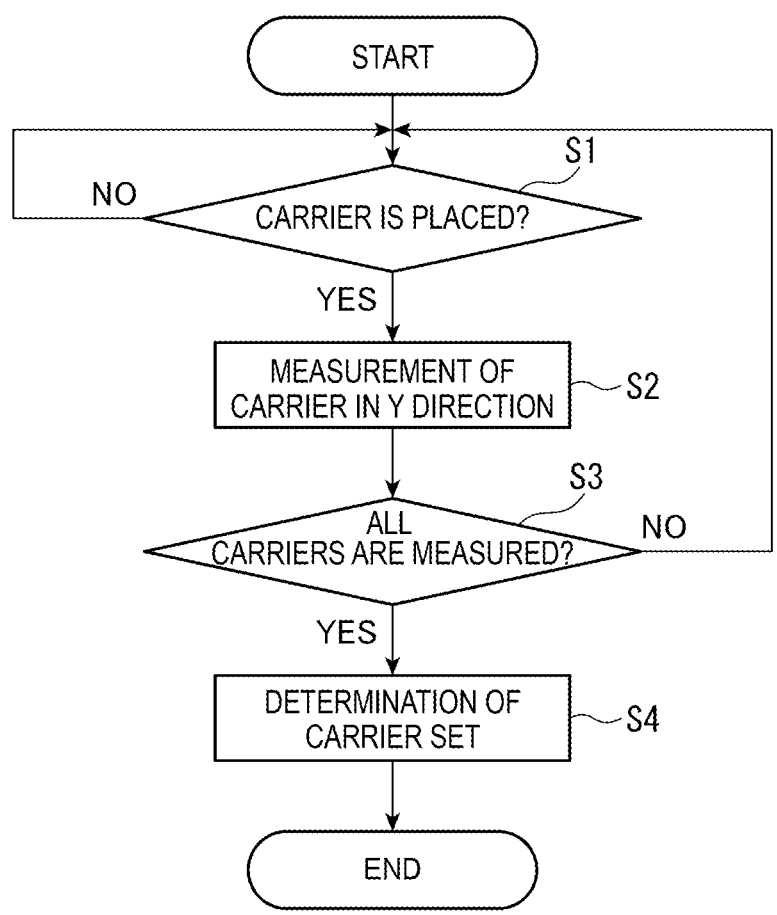
FIG. 5 is a flowchart showing an example of a carrier management method for standard semiconductor wafers according to an exemplary embodiment of the invention.

FIG. 5 is a flowchart showing an example of the carrier management method for the standard semiconductor wafers, the carrier management method being executed by the controller 51 of the computer 43.

In an initial state of the carrier measuring device 1, the stage 12 is first positioned close to a rear end of the platform 11. In this initial state, the operator or a transfer mechanism (not shown) places each carrier 21 in the stage 12. The carrier 21 is placed in the stage 12 in a direction where the center C4 of the hole 21A formed in the carrier 21 coincides with the center C1 of the rotary table 23 as shown in FIG. 1.

The controller 51 of the computer 43 judges whether the carrier 21 is placed in a predetermined position (Step S1). This process is performed by, for instance, judging whether a detection signal from a sensor configured to detect a position of the stage 12 and a detection signal from a sensor configured to detect a housed state of the carrier 21 in the carrier receiver 23A formed in the stage 12 are properly input.

When a judgment result in Step S1 is "NO", the controller 51 repeats the judgment process. When each of the detection signals is properly input, the judgment result in Step S1 is "YES" and the controller 51 proceeds to Step S2.

In Step S2, the controller 51 executes the measurement process of the carrier 21 in the Y direction, which is described in the measurement (1) of the carrier measurement method. Subsequently, the controller 51 proceeds to Step S3.

In Step S2, the controller 51 controls the Y-axis motor 34 to slide the stage 12 in the Y positive direction and controls the upper thickness sensor 41 and the lower thickness sensor 42 to measure the thickness of the carrier 21 in a range of, for instance, 50 mm in the Y negative direction from the position that is approximately 5 to 7 mm distant from the point $P_1$ (shown in FIG. 1) of the hole 21A, thereby obtaining a detection signal of the measurement results of the thickness.

The controller 51 stores, in a predetermined storage area of the storage 52, the measurement results of the thickness of the carrier 21 close to the point $P_1$ together with an identification number assigned to the carrier 21.

In Step S3, the controller 51 judges whether all the carriers 21 are measured for the thickness in the Y direction. When the judgment result in Step S3 is "NO", the controller 51 returns to Step S1 and repeats the processes of Steps S1 and S2.

When the judgment result in Step S3 is "YES" (i.e., when all the carriers 21 are measured for the thickness in the Y direction), the controller 51 proceeds to Step S4.

In Step S4, the controller 51 calculates an average value of the measurement results of each carrier 21, which are stored in the storage 52, and classifies, on the basis of the obtained average values, the carriers 21 falling within a predetermined thickness range (for instance, in every 0.3-μm range) into the same class. Specifically, examples of the classes into which the carriers 21 are classified in terms of the average thickness include a class of 778.6 mm or less, a class in a range from 778.7 μm to 778.9 μm, and a class in a range from 783.5 μm to 783.7 μm.

Next, the controller 51 selects a predetermined number (e.g., five) of carriers 21 from a plurality of carriers 21 belonging to the same class, as a set (carrier set) used together in the same batch in double-side polishing of a plurality of semiconductor wafers, and stores, in a predetermined storage area of the storage 52, an identification number assigned to the carrier set. Subsequently, the controller 51 ends a series of processes.

(B) Carrier Management Method for High-Precision Semiconductor Wafers

Next, description is made on a management method of carriers 21 used in double-side polishing of high-precision semiconductor wafers that require a high-precision specification (e.g., flatness and surface roughness). In this carrier management method, both the measurements (1) and (2) of the carrier measurement method are performed.

It should be noted that the processes of classifying a plurality of carriers 21 on the basis of average thicknesses thereof and subsequently forming a carrier set(s) are the same as those in the carrier management method (A) (see FIG. 5), which is described in in paragraphs 0060 to 0070, and thus are briefly described below.

When each carrier 21 is placed in a predetermined position of the stage 12 in a predetermined direction, the controller 51 controls the Y-axis motor 34, the upper thickness sensor 41 and the lower thickness sensor 42 to operate for measuring the thickness of the carrier 21 close to the point $P_1$ of the hole 21A. Subsequently, the controller 51 stores, in a predetermined storage area of the storage 52, the measurement results together with an identification number of the carrier 21.

The controller 51 executes the above-described processes on all the carriers 21. Subsequently, the controller 51 classifies each carrier 21 on the basis of the measurement results stored in the storage 52, determines a carrier set including a plurality of carriers 21 belonging to the same class, and stores, in a predetermined storage area of the storage 52, an identification number assigned to the carrier set.

Figure 6:
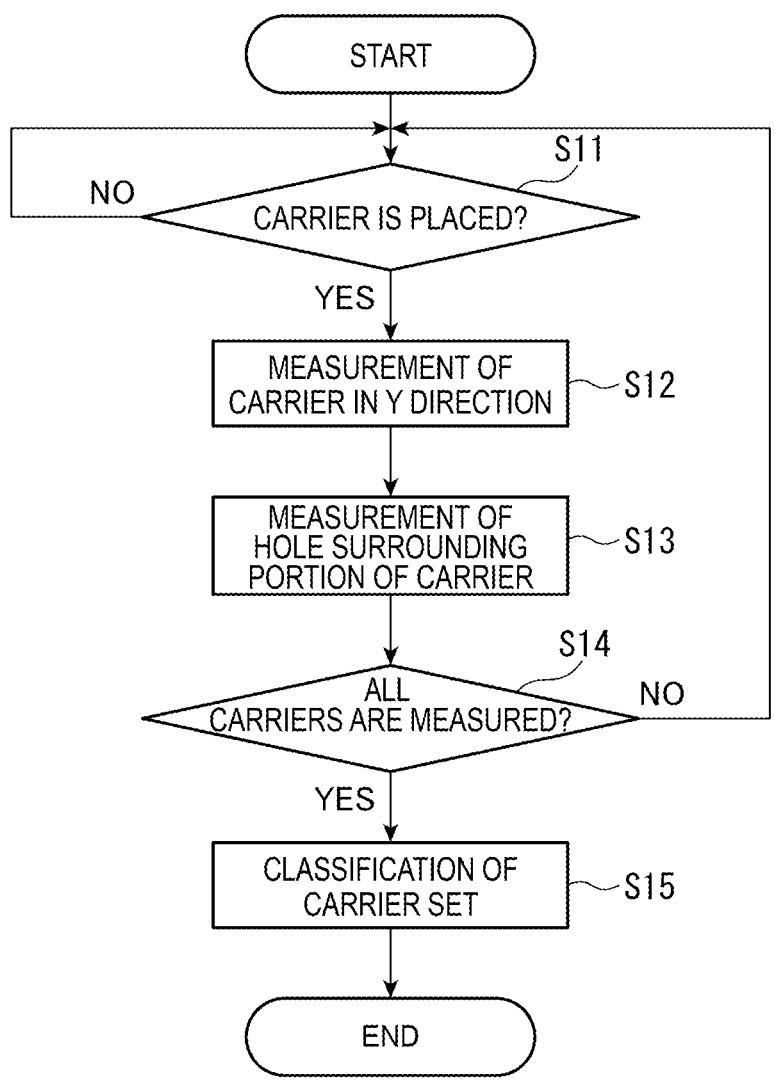
FIG. 6 is a flowchart showing an example of a carrier management method for high-precision semiconductor wafers according to the exemplary embodiment of the invention.

FIG. 6 is a flowchart showing an example of the carrier management method for the high-precision semiconductor wafers, the carrier management method being executed by the controller 51 of the computer 43. Processes of Steps S11 and S12 are substantially the same as the processes of Steps S1 and S2, respectively, which are shown in FIG. 5 and described in paragraphs 0060 to 0066, and thus are briefly described below.

When each carrier 21 is placed in a predetermined position of the stage 12 in a predetermined direction (Step S11), the controller 51 controls the Y-axis motor 34, the upper thickness sensor 41 and the lower thickness sensor 42 to operate for measuring the thickness of the carrier 21 close to the point $P_1$ of the hole 21A. Subsequently, the controller 51 stores, in a predetermined storage area of the storage 52, the measurement results together with the identification number of the carrier 21 and the identification number of the carrier set to which the carrier 21 belongs (Step S12).

In Step S13, the controller 51 executes the measurement process of the hole surrounding portion 21C, which is described in the measurement (2) of the carrier measurement method. Subsequently, the controller 51 proceeds to Step S14.

In Step S13, the controller 51 controls the Y-axis motor 34 to slide the stage 12 in the Y negative direction to position the hole surrounding portion 21C between the upper thickness sensor 41 and the lower thickness sensor 42. Next, the controller 51, while the stage 12 is stopped, controls the table drive motor 24 to rotate the rotary table 23 and concurrently controls the upper thickness sensor 41 and the lower thickness sensor 42 to measure a roll-off amount (unit: μm) of the hole surrounding portion 21C, and obtains a detection signal of the roll-off amount. In this case, the controller 51 controls the Y-axis motor 34, the upper thickness sensor 41 and the lower thickness sensor 42 to operate for measuring the roll-off amount (unit: μm) of the hole surrounding portion 21C, for instance, on a total of 360 lines (i.e., on one line per degree of the central angle of the hole 21A) along the entire circumference of the hole surrounding portion 21C, and obtains a detection signal of the roll-off amount.

The controller 51 stores, in a predetermined storage area of the storage 52, the measurement results of the roll-off amount of the carrier 21 along the entire circumference of the hole surrounding portion 21C together with the identification number of the carrier 21 and the identification number of the carrier set to which the carrier 21 belongs.

In Step S14, the controller 51 judges whether all carriers 21 belonging to the carrier set are measured for the thickness in the Y direction and the roll-off amount of the hole surrounding portion 21C. When the judgment result in Step S14 is "NO", the controller 51 returns to Step S11 and repeats the processes of Steps S11 and S13.

When the judgment result in Step S14 is "YES" (i.e., when all the carriers 21 belonging to the carrier set are measured for the thickness in the Y direction and the roll-off amount of the hole surrounding portion 21C), the controller 51 proceeds to Step S15.

In Step S15, the controller 51 classifies the carriers into the carrier sets. Subsequently, the controller 51 ends a series of processes.

Next, ranking of the carrier sets each including the plurality of carriers 21 is described. Table 1 shows an example of a rank table used for ranking the carrier sets.

TABLE 1

| | Maximum Roll-off Amount of Hole Surrounding Portions | | |
| --- | --- | --- | --- |
| | Small | Medium | Large |
| Rank of Carrier Set | A | B | C |

In a column showing items in Table 1, a "maximum roll-off amount of the hole surrounding portions" refers to a maximum value of roll-off amounts in the carrier set which are measured at 360 points (i.e., on 360 lines) of the hole surrounding portion 21C that surrounds the hole 21A in each carrier 21 by the measurement (2) of the carrier measurement method.

The carrier sets are each ranked using this "maximum roll-off amount of the hole surrounding portions". Ranks may be appropriately set according to the "maximum roll-off amount of the hole surrounding portions". For instance, as shown in Table 1, the "maximum roll-off amounts of the hole surrounding portions" are classified into three groups, i.e., "Small", "Medium" and "Large", and the carrier sets are each ranked into any of "A", "B" and "C", which are set according to the above classification. A specification (mainly flatness) satisfied by the semiconductor wafers decreases in accordance with the ranks of the carrier set to be used, in order of A, B and C.

Next, description is made on a relationship between the maximum roll-off amount of the hole surrounding portions and a roll-off amount of wafer outer circumferential portions in double-side polishing of semiconductor wafers using the carrier sets managed in the carrier management method. The following conditions are applied.

(i) A double-side polishing device is mounted with a carrier set of five carriers 21 respectively configured to hold five semiconductor wafers and performs double-side polishing of the five semiconductor wafers.

(ii) The double-side polishing device has a typical planetary gear mechanism.

(iii) A total of 50 batches in the double-side polishing process are executed using different carrier sets.

(iv) WaferSight 2 manufactured by KLA-Tencor Corporation is used as a measuring device configured to measure the roll-off amount of the wafer outer circumferential portion and the like.

Figure 7:
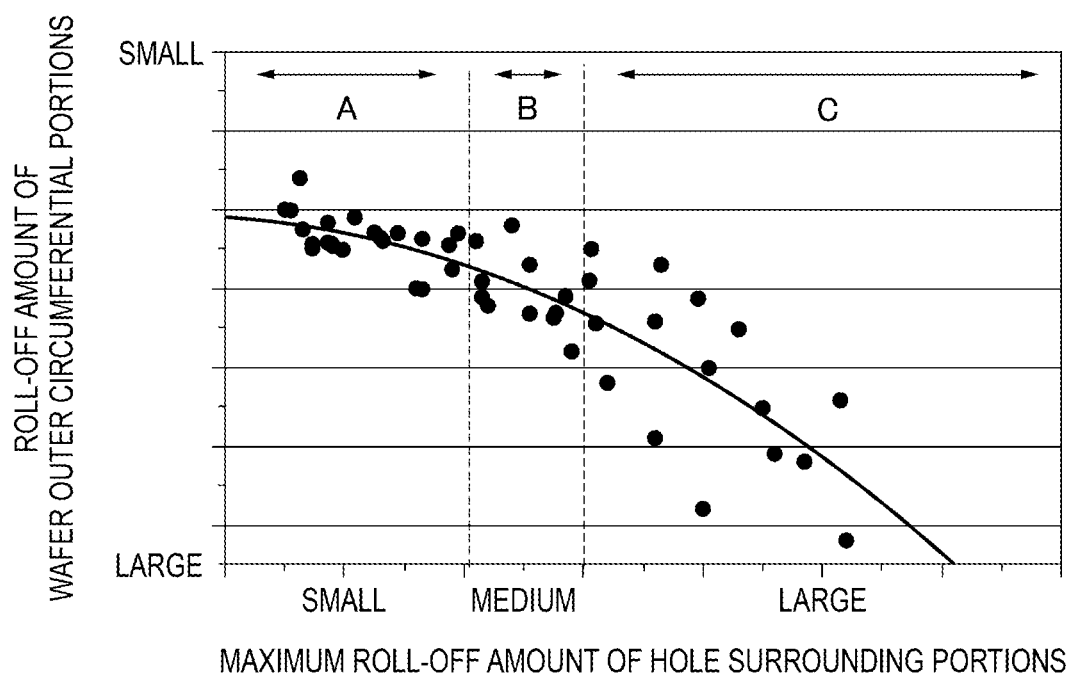
FIG. 7 is a diagram showing an example of a relationship between a maximum roll-off amount of hole surrounding portions of respective carriers and a roll-off amount of the corresponding wafer outer circumferential portions.

FIG. 7 is a diagram showing an example of a relationship, in each of the batches, between the maximum roll-off amount of the hole surrounding portions 21C of the carriers 21 in the carrier set and the maximum roll-off amount of the wafer outer circumferential portions of the semiconductor wafers. In this example, the carrier set is used in performing double-side polishing of the semiconductor wafers according to the above conditions and the semiconductor wafers are obtained by performing double-side polishing in the batch. A method of ranking the carrier sets according to the maximum roll-off amount of the hole surrounding portions, which are shown in an abscissa axis, is the same as the method described regarding Table 1. The roll-off amount of the wafer outer circumferential portion, which is shown in an ordinate axis, is determined as Edge Site flatness Front reference least sQuare Deviation (ESFQD) that is one of indices for the flatness of the wafer outer circumferential portion of the semiconductor wafer.

ESFQD is an unsigned maximum displacement amount from an in-site plane serving as a reference plane. The in-site plane is determined by defining fan-shaped sectors in the wafer outer circumferential portion of the semiconductor wafer and calculating height data in each sector by a method of least squares. Each site in the sector has one value of ESFQD.

It is clear from FIG. 7 that the larger the maximum roll-off amount of the hole surrounding portions 21C of the carriers 21 is, the larger the roll-off amount of the wafer outer circumferential portions is. A, B and C shown in FIG. 7 respectively correspond to the ranks A, B and C of the carrier set, which are shown in Table 1.

As described above, in the exemplary embodiment, since the thickness of the hole surrounding portion 21C of each carrier 21 can be measured along the entire circumference of the hole surrounding portion 21C by the measurement (2) of the carrier measurement method, a local roll-off of the hole surrounding portion 21C, which is conventionally not detectable, can be detected.

Further, in the exemplary embodiment, since the upper thickness sensor 41 and the lower thickness sensor 42 each remain fixed at the middle in the longitudinal direction of the sensor frame 14, the thickness and a shape of the carrier 21 can be highly accurately measured and, unlike the conventional art where thickness sensors are positioned by being rotated, positioning control of the upper thickness sensor 41 and the lower thickness sensor 42 is eliminated.

Furthermore, in the exemplary embodiment, the thickness and shape of the plurality of carriers 21 forming each carrier set are measured by the measurements (1) and (2) of the carrier measurement method and the carrier set is ranked in advance according to the rank table shown in Table 1 using the measurement results. Then, the carrier set in the rank corresponding to the specification required for the semiconductor wafers is used to perform double-side polishing of the semiconductor wafers. Thus, the semiconductor wafers satisfying the required specification can be obtained.

It should be noted that the specific arrangement of the invention, which is not limited by the exemplary embodiments of the invention described in detail with reference to the attached drawings, encompasses design modifications and the like as long as such modifications are compatible with an object of the invention.

For instance, in the above exemplary embodiment, the roll-off amount of the hole surrounding portion 21C is defined as a value obtained by subtracting, from an average thickness of the carrier 21 in the reference surface, a minimum thickness of the carrier 21 in a region of 2 mm from the hole edge 21D defining the hole 21A toward the outer circumference of the carrier 21. However, the roll-off amount of the hole surrounding portion 21C is not necessarily defined in this manner. For instance, regarding the carrier 21 for the high-precision semiconductor wafer, the roll-off amount of the hole surrounding portion 21C may be defined as a value obtained by subtracting, from an average thickness of the carrier 21 in the reference surface, a minimum thickness of the carrier 21 in a region of 1 mm from the hole edge 21D defining the hole 21A toward the outer circumference of the carrier 21.

The above exemplary embodiment shows the example in which the slide unit 13 configured to slide the stage 12 in the Y direction includes the guide rails 32, the ball screw 33, the Y-axis motor 34 and the like. Alternatively, the slide unit 13 may include a linear motor and the like.

The above exemplary embodiment shows the example in which the upper thickness sensor 41 and the lower thickness sensor 42 are each a laser displacement sensor. Alternatively, the upper thickness sensor 41 and the lower thickness sensor 42 may be each any other type of non-contact sensor such as a capacitance sensor.

The above exemplary embodiment shows the example in which the stage 12 is slid by the slide unit 13 in the Y direction while the upper thickness sensor 41 and the lower thickness sensor 42 are each fixed to the sensor frame 14. Alternatively, the sensor frame 14 to which the upper thickness sensor 41 and the lower thickness sensor 42 are fixed may be slid in the Y direction while the stage 12 is fixed. A slide unit configured to slide the sensor frame 14 in this arrangement may be configured in the same manner as the above-described slide unit 13. Additionally, both the stage 12 and the sensor frame 14 may be slid in the Y direction.

The invention claimed is:

1. A carrier measuring device configured to measure a thickness of a carrier having a hole in which a disc-shaped semiconductor wafer is to be held, the hole being eccentric with respect to the carrier, the carrier measuring device comprising:
   a rotary table comprising a carrier receiver configured to horizontally house the carrier;
   a table drive motor configured to rotate the rotary table around a center axis thereof as a rotation axis;
   an upper thickness sensor and a lower thickness sensor configured to be positioned above and below the carrier, respectively, and measure the thickness of the carrier in a non-contact manner; and
   a slide unit configured to slide, in a horizontal direction, one or both of: the rotary table; and the upper thickness sensor and the lower thickness sensor, wherein
   the carrier receiver is formed to be capable of housing the carrier in a manner that a center of the hole of the carrier coincides with a center of the rotary table.

2. The carrier measuring device according to claim 1, further comprising a sensor frame attached with the upper thickness sensor and the lower thickness sensor between which the rotary table is capable of passing through in the horizontal direction.

3. The carrier measuring device according to claim 2, wherein
   the upper thickness sensor and the lower thickness sensor are attached to the sensor frame in a manner to be respectively positioned above and below a straight line passing through the center of the rotary table and a center of the carrier receiver, and
   the slide unit slides one or both of the rotary table and the sensor frame in the horizontal direction parallel to the straight line.

4. A carrier measurement method for measuring, by using the carrier measuring device according to claim 1, a thickness of a disc-shaped carrier having a hole in which a disc-shaped semiconductor wafer is to be held, the hole being eccentric with respect to the carrier, the carrier measurement method comprising:
   first measuring the thickness of the carrier at a predetermined point while sliding, in the horizontal direction, one or both of: the rotary table in which the carrier is housed; and the upper thickness sensor and the lower thickness sensor; and
   second measuring a thickness of a hole surrounding portion that surrounds the hole of the carrier while rotating the rotary table in which the carrier is housed.

5. A carrier management method for managing, on a basis of measurement results obtained through measurement using the carrier measuring device according to claim 1, a plurality of disc-shaped carriers each having a hole in which a disc-shaped semiconductor wafer is to be held, the hole being eccentric with respect to the corresponding carrier, the carrier management method comprising:

first measuring the thickness of each of the carriers at a predetermined point while sliding, in the horizontal direction, one or both of: the rotary table in which the carrier is housed; and the upper thickness sensor and the lower thickness sensor;

classifying the carriers falling within a predetermined range of the thickness into the same class on a basis of the measurement results in the first measuring;

selecting a predetermined number of carriers from the carriers belonging to the same class to determine a carrier set to be used in the same batch in double-side polishing of the semiconductor wafers;

second measuring a thickness of a hole surrounding portion that surrounds the hole of each of the carriers of the carrier set while rotating the rotary table in which the carriers are housed; and ranking the carrier set on a basis of the measurement results in the first and second measuring according to a specification required for the semiconductor wafers.

6. The carrier management method according to claim 5, wherein in the ranking, a roll-off amount of the hole surrounding portion of each of the carriers is calculated on a basis of the measurement results in the second measuring and the carrier set is ranked on a basis of the measurement results in the first measuring and the roll-off amounts of the hole surrounding portions.

* * * * *